(12) United States Patent
Kochar et al.

(10) Patent No.: US 9,804,922 B2
(45) Date of Patent: Oct. 31, 2017

(54) PARTIAL BAD BLOCK DETECTION AND RE-USE USING EPWR FOR BLOCK BASED ARCHITECTURES

(71) Applicant: SanDisk Technologies Inc., Plano, TX (US)

(72) Inventors: Mrinal Kochar, San Jose, CA (US); Abhijeet Bhalerao, San Jose, CA (US); Derek McAuley, San Jose, CA (US); Piyush Sagdeo, San Jose, CA (US)

(73) Assignee: SanDisk Technologies LLC, Plano, TX (US)

( * ) Notice: Subject to any disclaimer, the term of this patent is extended or adjusted under 35 U.S.C. 154(b) by 79 days.

(21) Appl. No.: 14/336,883

(22) Filed: Jul. 21, 2014

(65) Prior Publication Data

US 2016/0019111 A1    Jan. 21, 2016

(51) Int. Cl.
| | |
|---|---|
| *G06F 11/00* | (2006.01) |
| *G06F 11/10* | (2006.01) |
| *G11C 29/52* | (2006.01) |
| *G06F 12/08* | (2016.01) |
| *G06F 11/07* | (2006.01) |
| *G11C 29/00* | (2006.01) |
| *G06F 11/14* | (2006.01) |
| *G06F 11/16* | (2006.01) |
| *G06F 11/20* | (2006.01) |

(52) U.S. Cl.
CPC ........ *G06F 11/1068* (2013.01); *G06F 11/073* (2013.01); *G06F 11/0751* (2013.01); *G06F 11/2094* (2013.01); *G06F 12/08* (2013.01); *G11C 29/52* (2013.01); *G11C 29/765* (2013.01); *G06F 11/141* (2013.01); *G06F 11/1666* (2013.01); *G06F 11/20* (2013.01)

(58) Field of Classification Search
CPC ............................ G06F 11/1068; G11C 29/52
See application file for complete search history.

(56) References Cited

U.S. PATENT DOCUMENTS

| | | |
|---|---|---|
| 7,171,536 B2 | 1/2007 | Chang et al. |
| 8,187,936 B2 | 5/2012 | Alsmeier et al. |

(Continued)

FOREIGN PATENT DOCUMENTS

| | | |
|---|---|---|
| JP | 2009301264 | 12/2009 |
| WO | WO 0049488 | 8/2000 |

OTHER PUBLICATIONS

Chundong Wang and Weng-Fai Wong, Extending the Lifetime of NAND Flash Memory by Salvaging Bad Blocks, 2012, p. 260-263.*

(Continued)

*Primary Examiner* — Matt Kim
*Assistant Examiner* — Katherine Lin
(74) *Attorney, Agent, or Firm* — Brinks Gilson & Lione

(57) ABSTRACT

Systems and methods for partial bad block reuse may be provided. Data may be copied from a block of a first memory to a block of a second memory. A post write read error may be detected in a first portion the data copied to the block of the second memory without detection of a post write read error in a second portion of the data copied to the block of the second memory. The block of the second memory may be determined to be a partial bad block usable for storage in response to detection of the post write read error in the first portion of the data but not in the second portion of the data.

19 Claims, 4 Drawing Sheets

(56) References Cited

U.S. PATENT DOCUMENTS

| | | |
|---|---|---|
| 2009/0161430 A1 | 6/2009 | Allen et al. |
| 2009/0222617 A1 | 9/2009 | Yano et al. |
| 2010/0174845 A1 | 7/2010 | Gorobets et al. |
| 2011/0080670 A1* | 4/2011 | Gubbins ............... B82Y 10/00 360/75 |
| 2011/0099460 A1* | 4/2011 | Dusija ................. G11C 11/5621 714/773 |
| 2013/0028021 A1 | 1/2013 | Sharon et al. |
| 2013/0031429 A1 | 1/2013 | Sharon et al. |
| 2013/0031430 A1 | 1/2013 | Sharon |
| 2013/0145085 A1 | 6/2013 | Yu et al. |
| 2015/0138885 A1* | 5/2015 | Iwai ...................... G11C 16/08 365/185.09 |
| 2015/0269025 A1* | 9/2015 | Krishnamurthy ... G06F 11/1092 714/6.24 |
| 2015/0348649 A1* | 12/2015 | Yang ...................... G11C 29/44 714/723 |

OTHER PUBLICATIONS

Wang et al., "3D-FlashMap", Design, Automation and Test in Europe, EDS Consortium, 111 West Saint John Street, Suite 2200, San Jose, CA 95113, pp. 1307-1312.

International Search Report and Written Opinion, dated Nov. 9, 2015, pp. 1-11, issued in International Patent Application No. PCT/US2015/040483, European Patent Office, Rijswijk, Netherlands.

Jaehoon Jang et al., Vertical Cell Array using TCAT(Terabit Cell Array Transistor) Technology for Ultra High Density NAND Flash Memory, dated 2009, pp. 192-193, Samsung Electronics Co. Ltd., 2009 Symposium on VLSI Technology Digest of Technical Papers, Nongseo-Dong, Giheung-Gu, Yongin-City, Gyeonggi-Do, Korea.

Arya, P., "A Survey of 3D Nand Flash Memory", *EECS Int'l Graduate Program, National Chiao Tung University*, 2012, pp. 1-11.

Nowak, E. et al., "Intrinsic Fluctuations in Vertical NAND Flash Memories", *2012 Symposium on VLSI Technology Digest of Technical Papers*, 2012, pp. 21-22.

Abhijeet Bhalerao et al., U.S. Appl. No. 14/045,294, filed Oct. 3, 2013, pp. 1-22.

Shinsuke Yada et al., U.S. Appl. No. 14/133,979, filed Dec. 19, 2013, pp. 1-121.

Seje Takaki, U.S. Appl. No. 14/136,103, filed Dec. 20, 2013, pp. 1-56.

\* cited by examiner

PARTIAL BAD BLOCK DETECTION AND RE-USE USING EPWR FOR BLOCK BASED ARCHITECTURES

BACKGROUND

1. Technical Field

This application relates to solid state memory and, in particular, to partial bad blocks in the solid state memory.

2. Related Art

As a die of solid state memory is subjected to stresses and screen, various blocks of the solid state memory may be marked as bad blocks because of failures. Such bad blocks may be called factory marked bad blocks. In order to meet capacity and performance requirements, a limited number of blocks may be factory marked bad blocks in order to pass quality tests.

During runtime, if a write error, such as a program failure, is reported by the solid state memory when writing to a block, the block may be retired and added to a bad block list. The solid state memory may have individually erasable segments, such as pages or blocks. Each of the erasable segments may be put through a limited number of erase cycles before becoming unreliable and being marked a bad block. The bad block may no longer be used to store data.

SUMMARY

A storage system may be provided that includes a solid state memory, a copy module, a post write read module, and an error recovery module. The solid state memory may include a first memory and a second memory. The copy module may copy data from a block of the first memory to a block of the second memory. The post write read module may detect any post write read error in the data copied to the block of the second memory. The error recovery module may determine that the block of the second memory is a partial bad block usable for storage in response to detection of a post write read error in a first portion of the data copied to the block of the second memory and no post write read error in a second portion of the data copied to the block of the second memory.

A storage device may be provided that includes a solid state memory, a copy module, a post write read module, and an error recovery module. The solid state memory may include a first memory and a second memory. The copy module may copy data from a block of the first memory to a block of the second memory. The post write read module may detect any post write read error in the data copied to the block of the second memory. The error recovery module may determine that the block of the second memory is a partial bad block in response to detection of a post write read error in a first portion of the data and no post write read error in a second portion of the data. The partial bad block may remain available for data storage despite the detection of the post write read error.

A method for partial bad block reuse may be provided. Data may be copied from a block of a first memory to a block of a second memory. A post write read error may be detected in a first portion the data copied to the block of the second memory without detection of a post write read error in a second portion of the data copied to the block of the second memory. The block of the second memory may be determined to be a partial bad block usable for storage in response to detection of the post write read error in the first portion of the data but not in the second portion of the data.

BRIEF DESCRIPTION OF THE DRAWINGS

The embodiments may be better understood with reference to the following drawings and description. The components in the figures are not necessarily to scale. Moreover, in the figures, like-referenced numerals designate corresponding parts throughout the different views.

DETAILED DESCRIPTION

Figure 1:
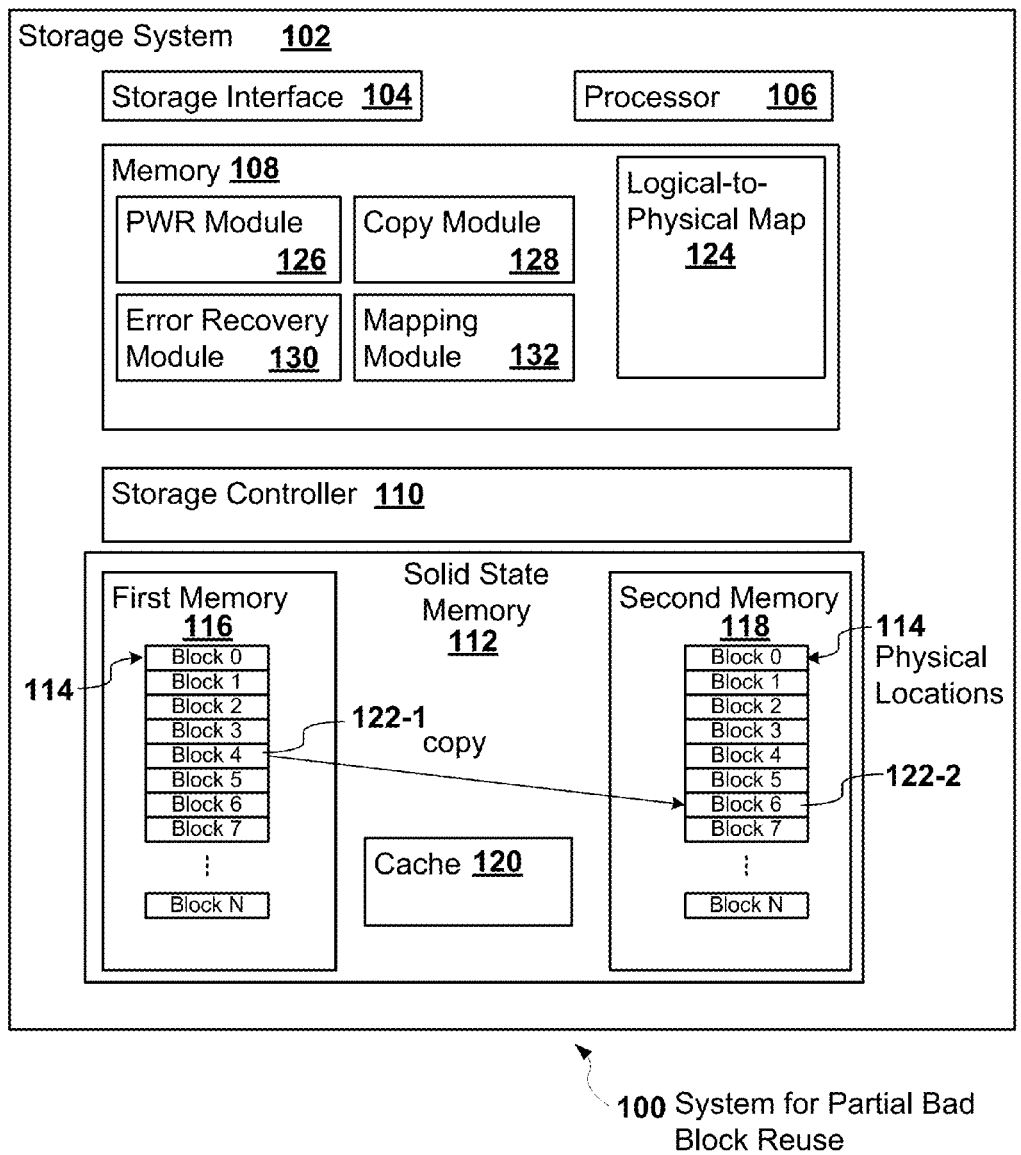
FIG. 1 illustrates an example of a system to reuse partial bad blocks of a storage system.

If a write error occurs when writing a block to a solid state memory, the block may be considered a bad block. However, the block may actually be a partial bad block. For example, the cause of the failure may be a defect only on one word line of the block, and the rest of the block may be useable for storage still. Retiring the block by adding the block to a bad block list may unnecessarily limit the product life of the solid state memory. Alternatively or in addition, if the number of factory marked bad blocks exceeds a threshold amount, then the solid state memory may have to be sold at half capacity or some other reduced capacity. Consequently, not using partial bad blocks may lead to lower production yields.

Systems and methods are described below that may rely on a post write read (PWR) or an Enhanced Post Write Read (EPWR) to detect and use partial bad blocks. The partial bad blocks may be either detected before shipping the solid state memory or detected during run-time. The post write read may be any operation that reads data from the block after the data was written to block in order to verify that the data read matches the data written to the block. An Enhanced Post Write Read (EPWR) may be a post write read operation that uses error correction code to reconstruct the originally written data even when errors may exist in a subset of the data read. The systems and methods may improve production yield, memory reliability, and/or product life.

A system may be provided in which the PWR may detect partial bad blocks and use the partial bad blocks after a failure recovery sequence. The defective parts of a block may be logically replaced by another existing block. When a failure due to a memory defect is encountered, the system may copy data that would otherwise have been stored at the location of the memory defect to another block or memory, such as to a binary cache. The system may update firmware data structures to reflect the same. The logical replacement of the defective parts of the block may be transparent to a user of the memory. Any read operation directed to the location of the memory defect may be automatically redirected to the new location.

In one example, a storage system may be provided that includes a solid state memory, a copy module, a post write read module, and an error recovery module. The solid state memory may include a first memory and a second memory, such as single level cell (SLC) flash memory and multi-level cell (MLC) flash memory. The copy module may copy data from a block of the first memory to a block of the second memory as part of a folding operation in order to move the data from the SLC flash memory to the MLC flash memory. The post write read module may detect any post write read error in the data copied to the block of the second memory. The error recovery module may determine that the block of the second memory is a partial bad block usable for storage in response to detection of a post write read error in a first portion of the data copied to the block of the second memory without detection of a post write read error in a second portion of the data copied to the block of the second memory.

FIG. 1 illustrates an example of a system 100 to reuse partial bad blocks of a storage system 102. The storage system 102 may include a storage interface 104, a processor 106, a memory 108, a storage controller 110, and solid state memory 112.

The storage system 102 may be a device or combination of devices that stores data in the solid state memory 112. For example, the storage system 102 may be a block device that comprises a device or combination of devices providing block level access to the data. A block device provides block level access by reading and writing data in the form of logical data blocks (LDAs). The storage system 102 may be in any form, such as a flash drive, a solid state drive, a hard drive, a storage area network (SAN), or any other read/writeable computer-readable storage medium that includes solid state memory.

The storage system 102 may be part of, or physically separate from, a host system (not shown). For example, the storage system 102 may be a storage device in the form of a portable memory card that may be carried between host devices. In another example, the storage system 102 may be a solid state disk (SSD) embedded in the host system. Alternatively or in addition, the storage system 102 may be a discrete storage device physically separate from the host system even when the storage system 102 is in communication with the host system.

The storage interface 104 may be any hardware based component configured to communicate data to and/or from the host system. The storage interface 104 may be a Serial Advanced Technology Attachment (also known as Serial ATA or SATA) interface, a SCSI (Small Computer System Interface) interface, a Universal Serial Bus (USB) circuit, an Ethernet interface or any other type of physical interface over which storage systems send and/or receive data.

The storage controller 110 may be any hardware based component that translates logical addresses, such as logical block addresses (LBAs), which are received from the host system, into appropriate signaling to access corresponding physical locations 114 of blocks 122 or subsets of the blocks, such as pages or word lines, in the solid state memory 112. Examples of the storage controller 110 may include a memory controller, a NAND controller, a NOR controller, a disk controller, a SCSI (Small Computer System Interface) controller, a Fibre Channel controller, an INFINIBAND® controller (INFINIBAND is a registered trademark of System I/O, Inc. of Beaverton, Oreg.), a Serial Attached SCSI controller, a PATA (IDE) controller, and a Serial ATA controller.

The solid state memory 112 may be any memory that includes one or more integrated circuit assemblies as memory. The solid state memory 112 may include a first memory 116 and/or a second memory 118. Examples of the solid state memory 112 may include NAND type flash memory, NOR type flash memory, static random access memory (SRAM), dynamic random access memory (DRAM) memory, electrically erasable programmable read-only memory (EEPROM), or any other type of solid state memory.

The first memory 116 and the second memory 118 may each include a portion of a semiconductor material from which the solid state memory 112 is constructed. The first memory 116 and the second memory 118 may each be portions of the same memory. Alternatively or in addition, the first memory 116 may include an integrated circuit that is physically distinct from an integrated circuit that includes the second memory 118. Alternatively, the first memory 116 may be included in the same integrated circuit in which the second memory 118 is included. In some examples, the first memory 116 may be a different type of memory than the second memory 116. For example, the first memory 116 may include single-level cell flash memory, whereas the second memory 118 may include multi-level cell flash memory. The size of the first memory 116 may be the same as, or different from, the size of the second memory 118.

The solid state memory 112 may include additional components. For example, the solid state memory 112 may include a cache 120. The cache 120 may temporarily store data before the data is written to the first memory 116 and/or the second memory 118. For example, the cache 120 may store data received from the host system over the storage interface 104 that is not large enough to fill an entire block 122. Once enough data is received from the host system to populate at least an entire block 122, the data may be copied from the cache 120 to a different physical location in the solid state memory 112, such as at a location in the first memory 116 and/or the second memory 118. The cache 120 may be a binary cache in some examples.

In addition to the solid state memory 112, the storage system 102 may include the memory 108 that includes a logical-to-physical map 124 and/or modules, such as a post write read (PWR) module 126, a copy module 128, an error recovery module 130 and/or a mapping module 132. The memory 108 may be any device for storing and retrieving data or a combination thereof. The memory 108 may include non-volatile and/or volatile memory, such as a random access memory (RAM), a read-only memory (ROM), an erasable programmable read-only memory (EPROM), or flash memory. Alternatively or in addition, the memory 108 may include any other form of data storage component.

The logical-to-physical map 124 may be a data structure, such as a table, and/or a module, such as a lookup module, that determines and/or stores a mapping between logical addresses and physical locations 114 of blocks 122 of the solid state memory 112. For example, the logical-to-physical map 124 may include a mapping between logical data blocks of a file system and the physical locations 114 of the blocks 122 or subsets of the blocks 122 of the solid state memory 112. The storage controller 110 may rely on the logical-to-physical map 124 when translating the logical addresses into appropriate signaling to access corresponding physical locations 114 of blocks 122.

The physical locations 114 may be locations in the solid state memory 112 where the blocks 122 are stored. Each of the blocks 112 may have a corresponding physical location 114. The physical location 114 may be a block number or other identifier that identifies the location where the corresponding block 122 is stored in the solid state memory 112. The physical locations 114 may include locations of other storage units, such as pages. A page may be smaller than the block 122.

The PWR module 126 may be any component that performs a post write read. The post write read may be any operation that reads data from the block 122 after the data was written to the block 122 in order to verify that the data read matches the data written to the block 122. The post write read may be an Enhanced Post Write Read (EPWR). The EPWR may be a post write read operation that uses error correction to reconstruct the originally written data even when errors may exist in a subset of the data that is read. Accordingly, in some examples, the PWR module 126 may include an EPWR module. The EPWR module may be any component that performs an EPWR.

The copy module 128 may be any component that copies data from the first memory 116 to the second memory 118. The data copied may be initially stored on a subset of the first memory 116 or on all the first memory 116. The copy module 128 may copy the data from a set of the blocks 122 of the first memory 116 to a set of the blocks 122 of the second memory 116.

In some examples, the copy module 128 may be a folding module. The folding module may be any component that folds data into a target block of the solid state memory 112. The data may be considered to be folded into a target block when the data is moved from one or more source blocks elsewhere in the solid state memory 112 to the target block. During a folding, the folding module may move the data from multiple source blocks to the target block, for example. The source blocks may be in the first memory 116 and the target block may be in the second memory 118. For example, the first memory 116 may include single-level cell flash memory and the second memory 118 may include multi-level cell flash memory. The folding may thereby increase availability of single-level cell flash memory. Increasing the availability of the single-level cell flash memory may be advantageous in some circumstances because the single-level cell flash memory may have faster write times than multi-level cell flash memory.

In other examples, the copy module 128 may be part of a wear leveling module. The wear leveling module may copy data from one physical location to another in order to prolong the service life of the solid state memory 112. For example, the data in any block 122 that does not change (or is relatively static) may be periodically moved so that the low usage cells of the block may be used for storing other more dynamic data. In still other examples, the copy module 128 may include any other type of component that copies data from the first memory 116 to the second memory 118.

During operation of the system 100 to reuse partial bad blocks, a post write read (PWR), such as an Enhanced Post Write Read (EPWR), may detect partial bad blocks. Referring to both FIGS. 1 and 2, the system 100 may detect and reuse a partial bad block 122-2 as described in more detail below.

A block 122-1 in the first memory 116 may include data. The logical-to-physical map 124-1 (prior to copying the data) may map logical addresses 202 to corresponding locations in the block 122-1 in the first memory 116.

The copy module 128 may copy the data from the block 122-1 in the first memory 116 to a block 122-2 in the second memory 118. The post write read module 126 may perform a post write read (PWR), such as an Enhanced Post Write Read (EPWR), by reading data from the block 122-2 in the second memory 118 and comparing with the data read from the block 122-1 of the first memory 116. If a post write read error is detected in a first portion 204 of the data, but not in a second portion 206 of the data, then the block 122-2 in the second memory 118 may be a partial bad block. Although the first portion 204 of the data was not successfully stored in the partial bad block 122-2, the second portion 206 of the data was successfully stored in the partial bad block 122-2 of the second memory 118.

Based on the detection of the post write read error in the first portion 204 of the data, the error recovery module 130 may copy the first portion 204 of the data from the block 122-1 of the first memory 116 to the cache 120. The mapping module 132 may change the mapping of the logical addresses 202 in order to account for the new physical locations of the data. By copying the first portion 204 of the data to the cache 120, the block 122-1 of the first memory 116 may be added to a free block list or otherwise freed because the block 122-1 is no longer needed to store the first portion 204 and the second portion 206 of the data.

Figure 2:
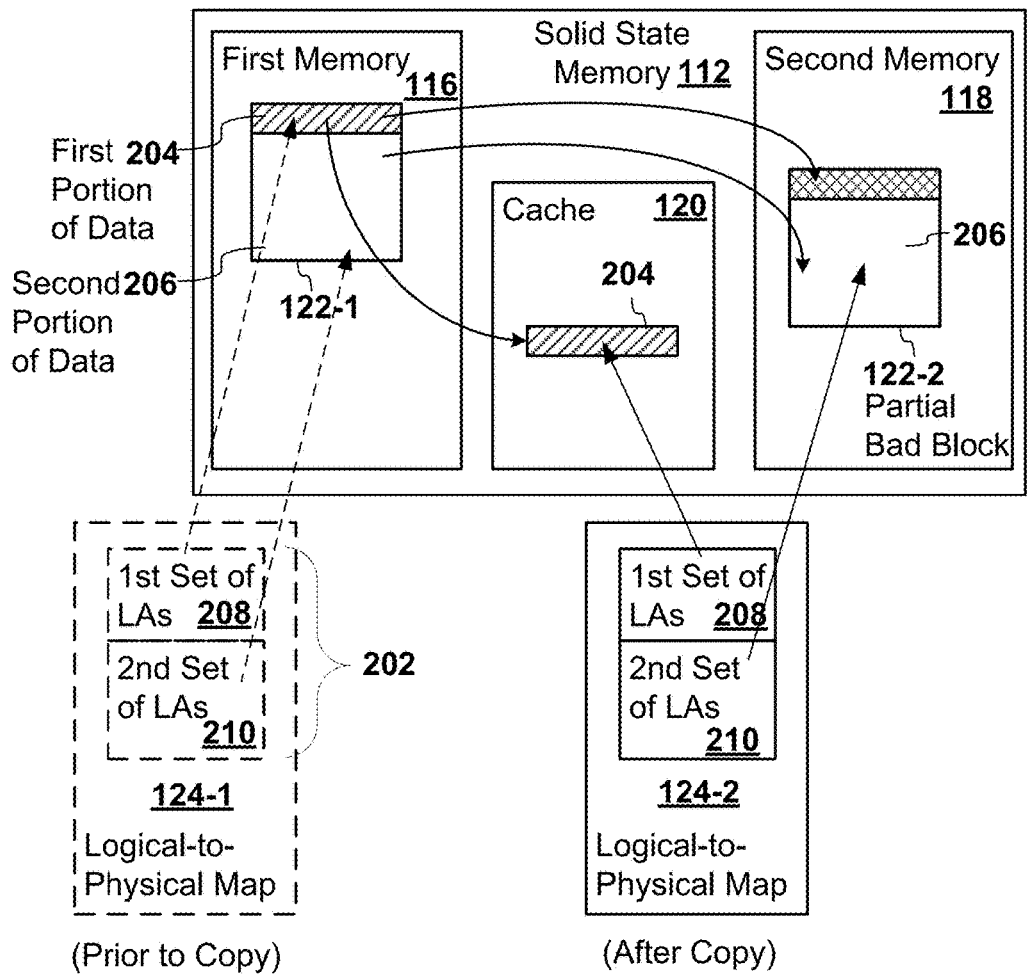
FIG. 2 illustrates an example of detecting a partial bad block.

Prior to copying the data and detecting the post write read error, a first subset 208 of the logical addresses 202 was mapped to one or more locations in the first memory 116 at which the first portion 204 of the data was stored. Similarly, a second subset 210 of the logical addresses 202 was mapped to one or more locations in the first memory 116 at which the second portion 206 of the data was stored. The logical-to-physical map 124-1 (prior to the copy) illustrated in FIG. 2 shows such a mapping.

The mapping module 132 may change the logical-to-physical map 124-1 so that the first subset 208 of the logical addresses 202 is mapped to one or more locations in the cache 120 where the first portion 204 of the data is stored. In addition, the mapping module 132 may change the logical-to-physical map 124-1 so that the second subset 210 of the logical addresses 202 is mapped to one or more locations in the partial back block 122-2 of the second memory 118 where the second portion 206 of the data is stored. The logical-to-physical map 124-2 (after the copy) illustrated in FIG. 2 shows such a mapping.

The storage controller 110, for example, may subsequently move the first portion 204 of the data, along with additional data received from the host system, from the cache 120 to the first memory 116, the second memory 118, and/or other portion of the solid state memory 112. The logical-to-physical map 124 may be updated accordingly. For example, the cache 120 may include data that is written to the storage system 100 by the host system, but that is not large enough to written to any block of the first memory 116, the second memory 118, and/or other storage memory. In one example, the cache 120 may include a set of SLC blocks where the storage system 100 stores fragmented data that comes from the host system. Once enough data is written to the cache 120, then a block of the data in the cache 120 may be written to an update block such as a MLC block or a different SLC block. By copying the first portion 204 of the data to the cache 120, the first portion 204 of the data may be placed in a queue for later copying along with enough data to fill a block.

When the copy module 128 copied the data from the block 122-1 in the first memory 116 to the block in the second memory 118, a write error may have occurred. For example, the write error may be a program error. The program error may be the result of a slow to program bit or some other defect. The system 100 may ignore the write error as long as the PWR indicates that all of the data or at least the second portion 206 of the data is successfully written to the block 122-2 of the second memory 118.

Copying the block 122-1 of the first memory 116 to the block 122-2 of the second memory 118 may refer to copying one or more blocks. For example, multiple blocks 122 of the first memory 116 may be copied to the one block 122-2 of the second memory 118. Alternatively or in addition, the one block 122-1 of the first memory 116 may be copied to multiple blocks 122 of the second memory 118. In still other examples, multiple blocks 122 of the first memory 116 may be copied to multiple blocks 122 of the second memory. The blocks 122 of the second memory 118 may be the same or different size than the blocks 122 of the first memory 116. The size of the first memory 116 may be the same or different size than the second memory 118.

If the first portion 204 of the data that failed to be copied to the block 122-2 of the second memory 118 is too large relative to the second portion 206 of the data, then the block 122-2 of second memory 118 may be considered a bad block instead of a partial bad block. The determination may be based on whether the number of pages of the block 122-2 that failed to be copied exceeded a threshold number of pages, for example. In alternative examples, a different set of criteria may be used to determine whether the block is a bad block instead of a partial bad block.

If the block 122-2 is determined to be a bad block, then a recovery sequence may be triggered. For example, the recovery sequence may involve copying of the data from NAND latches, BRAM (Block RAM), and/or other structures to a new block. The block 122-2 of second memory 118 may be retired to a grown bad block list thereby reducing available spares in the system 100.

Figure 3:
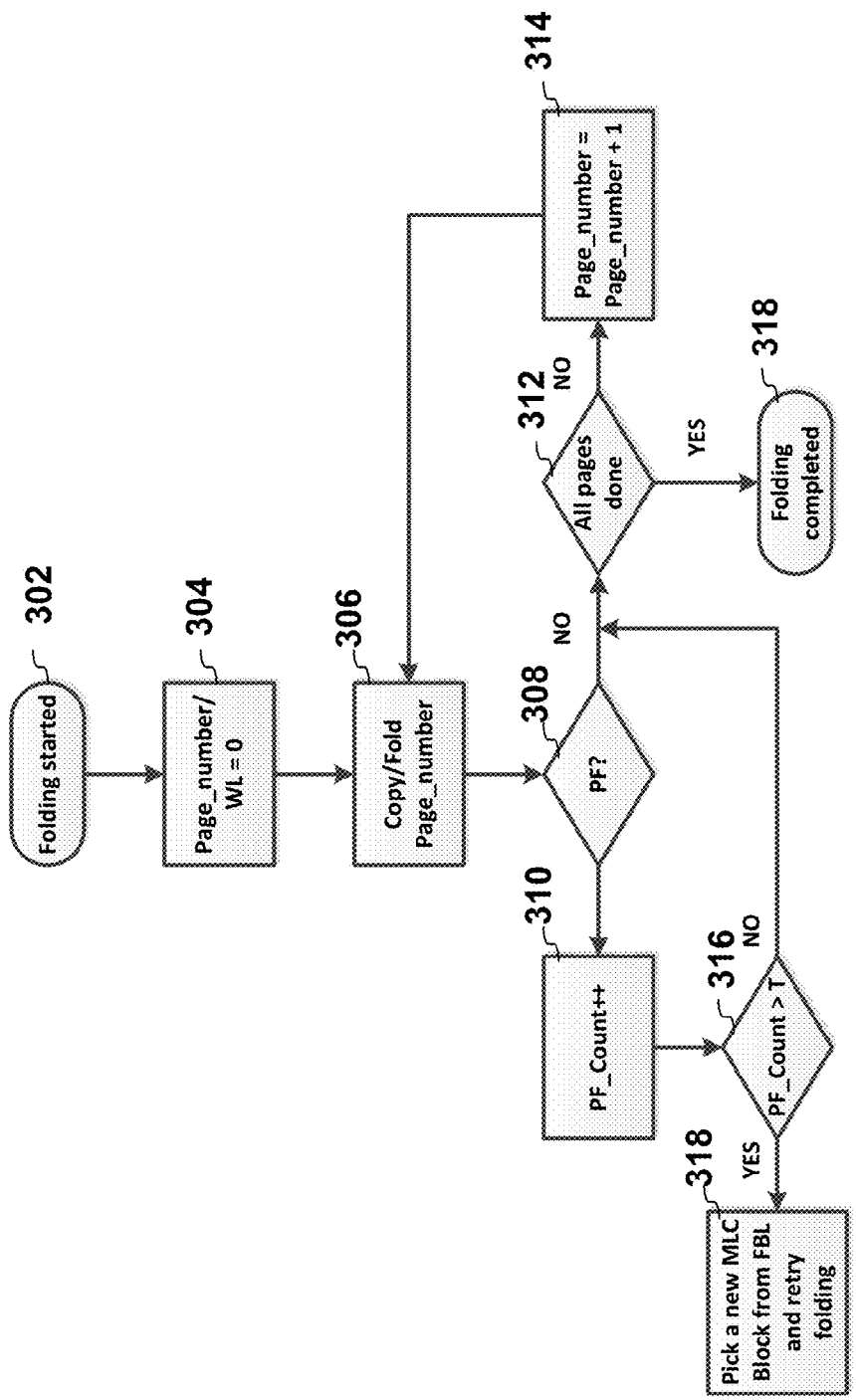
FIG. 3 illustrates a flow diagram of an example of logic for folding data.

FIG. 3 illustrates a flow diagram of an example of the logic for folding data with the system 100. The logic in the example is for folding the block 122-1 of the first memory 116, which is single level cell (SLC) flash memory, to the block 122-2 of the second memory 118, which is multi-level cell (MLC) flash memory.

The folding may be performed one page, one word line (WL), or some other storage unit at a time. For example, in starting (302) the folding, an index identifying the page number and/or word line may be set (304) to zero. The page and/or word line identified by the index may be copied (306) from the block 122-1 of the first memory 116 to the block 122-2 of the second memory 118.

If no program fault (write failure) is detected (308) when the page and/or word line identified by the index is copied, then a determination (312) may be made whether any more pages and/or word lines in the block 122-1 still need to be copied. If more copying is needed, then the index is incremented (314), and operations may return to copy (306) the page and/or word line identified by the index. Alternatively, if no more copying is needed, then the folding may be complete (318).

On the other hand, if a program fault (or any type of write failure) is detected (308), then a program fault count may be incremented (310). The program fault count may indicate the number of program faults or write errors that were detected when copying the block 122-1 of the first memory 116 to the block 122-2 of the second memory 118.

A determination (316) may be made whether the program fault count exceeds a threshold value. If the program fault count does not exceed the threshold value, then operations may proceed to the determination (312) whether any more pages and/or word lines in the block 122-1 still need to be copied. In other words, the block 122-2 of the second memory 118 may still potentially be a partial bad block instead of a bad block. Alternatively, if the threshold value is exceeded, then the block 122-2 of the second memory 118 may be added to a bad block list or a grown defects list, and a new MLC block in second memory 118 may be selected (318) from a free block list. The system 100 may return to start (302) the folding of the block 122-1 of the first memory 116 to the new MLC block of the second memory 118 instead of to the block 122-2 of the second memory 118.

In other words, even though a program fault or other write error may be detected, the system 100 may continue to attempt to use the block 122-2 of the second memory 118. A program failure/data recovery is not necessarily initiated. The block 122-2 of the second memory 118 is not retired unless the number of program failures detected when copying to the block 122-2 exceeds the threshold value.

After the block 122-1 of the first memory 116 is folded into the block 122-2 of the second memory 118, the post write read operation, such as the EPWR, may be performed on the block 122-2 of the second memory 118. Alternatively, the post write read operation may be performed on each portion of the block 122-2 of the second memory 118 before the block 122-1 of the first memory 116 is completely folded into the block 122-2 of the second memory 118.

Figure 4:
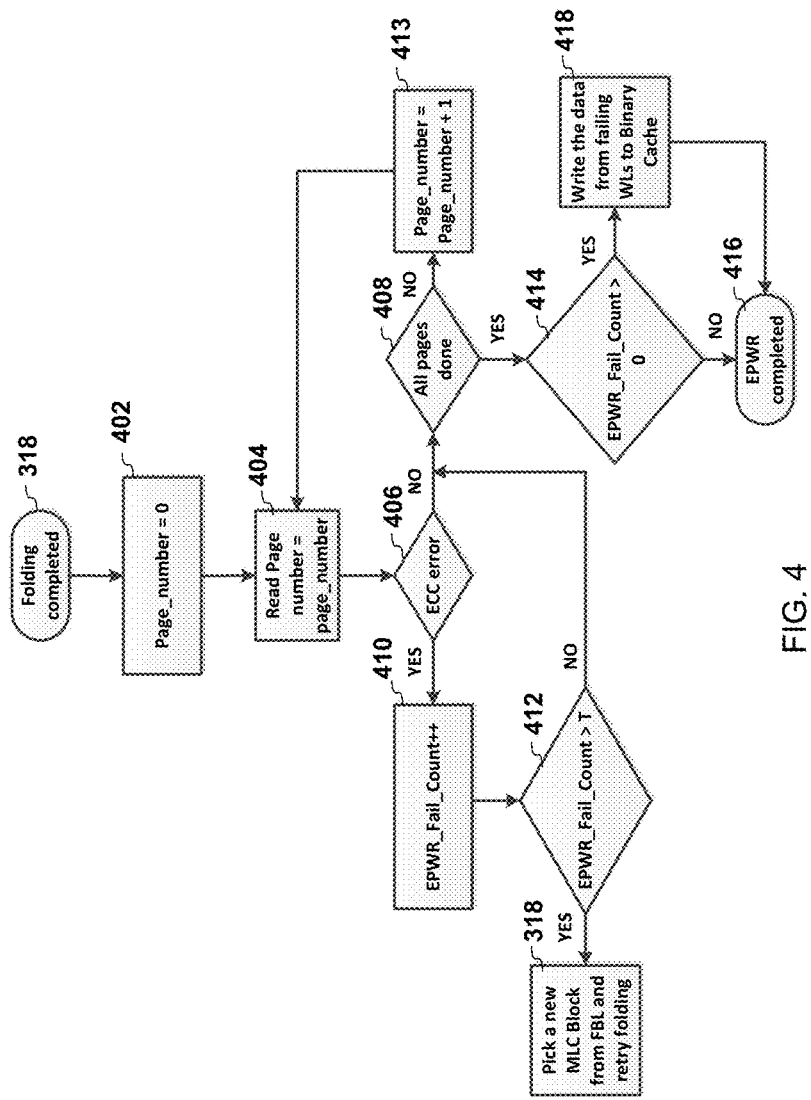
FIG. 4 illustrates a flow diagram of an example of EPWR logic and defect handling.

FIG. 4 illustrates a flow diagram of an example of the EPWR logic and defect handling. Operations may begin, for example, after the folding is complete (318).

The EPWR operation may be performed one page at a time. For example, a page index may be set (402) to zero. The page identified by the page index may be read (404) from the block 122-2 of the second memory 118.

Because the post write read operation in this example is the EPWR operation, a determination (406) is made whether an error correction code (ECC) error is detected in the page read from the block 122-2 of the second memory 118. If no ECC error is detected, then a determination (408) may be made whether all of the pages in the block 122-2 have been checked for errors. Alternatively, if an ECC error is detected, then an EPWR fail count may be incremented (410). The EPWR fail count may indicate the number of pages of the block 122-2 of the second memory 118 that encountered a post write read error.

If the EPWR fail count is incremented, then a determination (412) may be made whether the EPWR fail count exceeds a threshold value. If the threshold value is exceeded, then a new MLC block in the second memory 118 may be selected (318) from a free block list, and the system 100 may return to start (302) the folding of the block 122-1 of the first memory 116 into the new MLC block of the second memory 118. The block 122-2 of the second memory may be added to a bad block list such as a grown defects list. Alternatively, if the EPWR fail count does not exceed the threshold value, then the system 100 may still attempt to use the block 122-2 of the second memory 118 to store data. Accordingly, if the EPWR fail count does not exceed the threshold value, then operations may proceed to the determination (408) of whether all of the pages in the block 122-2 have been checked for post write read errors. If not all of the pages have been checked, then the page index may be incremented (413), and operations may return to read (404) the page identified by the page index.

Once all of the pages in the block 122-2 have been checked for post write read errors, then a determination (414) may be made whether the EPWR fail count is nonzero. If the EPWR fail count is zero, then the EPWR check may be complete (416). Alternatively, if the EPWR fail count is nonzero, then the portion of the data that would have otherwise been copied to the failed pages or word lines (in other words, the first portion 204 of the data) is copied (418) to the cache 120. Firmware data structures, such as a binary cache index, may then be updated to reflect that the first portion 204 of the data is to be read from the cache 120.

The writes and reads illustrated in FIGS. 3 and 4, respectively, may be performed on per page, per word line, or per any other storage unit. The references to the SLC and the MLC flash memories are merely illustrative of the first and second memories 116 and 118.

References to the blocks 122 may instead refer more generally to storage units. Each storage unit may be a unit of data that storage controller 110 may read or write. The storage unit may be a physical block, a page, a word line, a sector, or any other unit of data that the storage controller 110 may read or write.

In one example, logical addresses 202 (LBA A to Y) are mapped to the data stored in the block 122-1 of the first memory 116 (block M) before folding. After folding the data into the block 122-2 of the second memory 118 (block N), the post write read detects that the block 122-2 of the second memory 118 (Block N) is a partial bad block, and the data corresponding to LBA A to B (the first portion 204 of the data) failed the post write read. The data corresponding to LBA A to B (the first portion 204 of the data) is copied to the cache 120. A binary cache index (the logical-to-physical map 124) is updated. The first set of logical addresses 208 (LBA A to B) are mapped to corresponding physical locations 114 in the cache 120. The second set of logical addresses 210 (LBA C to Y) are mapped to corresponding physical locations 114 in the block 122-2 of the second memory 118 (Block N). Table 1 illustrates the mappings before and after the folding.

TABLE 1

| Logical Block Address | Mapped to |
| --- | --- |
| LBA A to Y | Block M in the first memory before folding |
| LBA A to B | The cache after folding |
| LBA C to Y | Block N in second memory after folding |

The system 100 may protect a product, which includes the solid state memory 112, from write errors caused by slow to program bits. For slow to program bits, the EPWR may pass (if the write errors are marginal failures) facilitating the system to continue without additional garbage collection of the blocks comprising slow to program bits. Furthermore, the system 100 may prevent retirement of the partial bad blocks thereby prolonging the product's life.

In production, all of the blocks 122 that are determined to be bad blocks (but which may actually be either partially bad blocks or bad blocks) may be identified as factory marked bad blocks. The system 102 may treat the factory marked bad blocks as good blocks by adding the factory marked bad blocks to the free block list. In other words, the free block lists may include the factory marked bad blocks and good blocks (the good blocks being blocks not marked as bad during production). At run time, when data is to be written to the solid state memory 112, a block is selected from the free block list and the data is written to the selected block. The PWR module 126 of the system 100 may then determine whether the selected block is a good block, a partial bad block, or a bad block as described above. If the selected block is a good block or a partial bad block, then the system 100 may use the selected block. If the selected bock is a bad block, then the selected block may be retired by, for example, adding the selected block to a grown defects list.

In other words, the factory marked bad blocks may initially be added to the free block list, and then later tested at runtime when selected from the free block list for writing. The selected block may then be either used as a partial bad block if the selected block is a partial bad block or added to a grown defects list if the selected block is a bad block (due to too many defective word lines, for example). Using the blocks 122 as partial bad blocks when possible may result in effectively increasing a production yield. Adding the selected bad block to a grown defects list on the first write to the block results in the selected block not being used for storage.

Alternatively, the copy module 128 may be included in a test module or be invoked by a test module during production to avoid partial bad blocks being initially added to the factory marked bad blocks. The test module may perform one or more tests in order to determine which blocks of the solid state memory 112 are to be factory marked bad blocks. The test module may add a block to a list of factory marked bad blocks if the block is determined to be a bad block. However, the test module may not add the block to the list of factory marked bad blocks if the block is determined to be a partial bad block. Instead, the block may be added to a free block list, for example, indicating that the block is available to store data such as host data. The first memory 116 may include test data that is written to the second memory 118. After the PWR module 126 identifies a partial bad block, then the first portion 204 of the data, which failed to successfully copy, may not need to be copied to the cache 120 because the data is just test data. Similarly, the logical-to-physical map 124 may not need to be updated by the mapping module 132 if just determining factory marked bad blocks.

The systems 100 and 102 may be implemented with additional, different, or fewer components. For example, the systems 100 and 102 may include the host system. Alternatively or in addition, the systems 100 and 102 may include only an integrated circuit that includes a subset of the components illustrated in FIG. 1, such as the solid date memory 112 and the storage controller 110.

Each component may include additional, different, or fewer components. In a first example, the memory 108 may include additional, different, or fewer modules than illustrated. In a second example, the solid state memory 112 may include additional memory portions. In a third example, the cache 120 may not be included in the solid state memory 112 that includes the first memory 116 and the second memory 118.

The logic illustrated in the flow diagrams may include additional, fewer, or different operations than illustrated. For example, the logic for folding data may include just copying the data from a block 122-1 of the first memory 116 to the block 122-2 of the second memory 118. In another example, the EPWR logic may include just detecting a post write read error in the first portion 204 the data copied to the block 122-2 of the second memory 118 but detecting no post write read error in the second portion 206 of the data copied to the block 122-2 of the second memory 118; and determining that the block 122-2 of the second memory 118 is a partial bad block usable for storage in response to detection of the post write read error in the first portion 204 of the data but not in the second portion 206 of the data. In addition, operations illustrated in the flow diagrams may be performed in a different order than illustrated.

The processor 106 may be in communication with the memory 108 and the storage interface 104. The processor 106 may be microprocessor, a general processor, a central processing unit, an application specific integrated circuit (ASIC), a digital signal processor, a field programmable gate array (FPGA), a digital circuit, an analog circuit, and/or any type of processor.

The processor 106 may be one or more devices operable to execute logic. The logic may include computer executable instructions or computer code embodied in the memory 108 or in other memory that, when executed by the processor 106, cause the processor 106 to perform the logic. The computer code may include instructions executable with the processor 106.

The system 100 may be implemented in many different ways. Each module, such as the PWR module 126, the copy module 128, the error recovery module 130, and the mapping module 132, may be hardware or a combination of hardware and software. For example, each module may include an application specific integrated circuit (ASIC), a Field Programmable Gate Array (FPGA), a circuit, a digital logic circuit, an analog circuit, a combination of discrete circuits, gates, or any other type of hardware or combination thereof. Alternatively or in addition, each module may include memory hardware, such as a portion of the memory 112, for example, that comprises instructions executable with the processor 106 or other processor, such as the storage controller 110, to implement one or more of the features of the module. When any one of the modules includes the portion of the memory that comprises instructions executable with the processor, the module may or may not include the processor. In some examples, each module may just be the portion of the memory 108 or other physical memory that comprises instructions executable with the processor 106 or other processor to implement the features of the corresponding module without the module including any other hardware. Because each module includes at least some hardware even when the included hardware comprises software, each module may be interchangeably referred to as a hardware module, such as the PWR hardware module 126, the copy hardware module 128, the error recovery hardware module 130, and the mapping hardware module 132. Similarly, each module may be interchangeably referred to as a circuit even when the respective module includes just the portion of the memory that comprises the executable instructions because the memory may be a circuit.

Some features are shown stored in a computer readable storage medium (for example, as logic implemented as computer executable instructions or as data structures in memory). Logic and data structures may be stored on, distributed across, or read from one or more types of computer readable storage media. Examples of the computer readable storage medium may include a hard disk, a floppy disk, a CD-ROM, a flash drive, a cache, volatile memory, non-volatile memory, RAM, flash memory, or any other type of computer readable storage medium or storage media. The computer readable storage medium may include any type of non-transitory computer readable medium, such as a CD-ROM, a volatile memory, a non-volatile memory, ROM, RAM, or any other suitable storage device.

The processing capability of the system 100 may be distributed among multiple entities, such as among multiple processors and memories, optionally including multiple distributed processing systems. Parameters, databases, and other data structures may be separately stored and managed, may be incorporated into a single memory or database, may be logically and physically organized in many different ways, and may implemented with different types of data structures such as linked lists, hash tables, or implicit storage mechanisms. Logic, such as programs or circuitry, may be combined or split among multiple modules, distributed across several memories and processors, and may be implemented in a library, such as a shared library.

The storage system 102 may be a semiconductor memory device that includes the solid state memory 112. Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which may also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices may be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions may also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations may be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories may be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this invention is not limited to the two dimensional and three dimensional exemplary structures described but cover all relevant memory structures within the spirit and scope of the invention as described herein and as understood by one of skill in the art.

All of the discussion, regardless of the particular implementation described, is exemplary in nature, rather than limiting. The respective logic, software or instructions for implementing the processes, methods and/or techniques discussed above may be provided on computer readable storage media. The functions, acts or tasks illustrated in the figures or described herein may be executed in response to one or more sets of logic or instructions stored in or on computer readable media. The functions, acts or tasks are independent of the particular type of instructions set, storage media, processor or processing strategy and may be performed by software, hardware, integrated circuits, firmware, micro code and the like, operating alone or in combination. Likewise, processing strategies may include multiprocessing, multitasking, parallel processing and the like. In one embodiment, the instructions are stored on a removable media device for reading by local or remote systems. In other embodiments, the logic or instructions are stored in a remote location for transfer through a computer network or over telephone lines. In yet other embodiments, the logic or instructions are stored within a given computer, central processing unit ("CPU"), graphics processing unit ("GPU"), or system.

Furthermore, although specific components are described above, methods, systems, and articles of manufacture described herein may include additional, fewer, or different components. For example, a processor may be implemented as a microprocessor, microcontroller, application specific integrated circuit (ASIC), discrete logic, or a combination of other type of circuits or logic. Similarly, memories may be DRAM, SRAM, Flash or any other type of memory. Flags, data, databases, tables, entities, and other data structures may be separately stored and managed, may be incorporated into a single memory or database, may be distributed, or may be logically and physically organized in many different ways. The components may operate independently or be part of a same program or apparatus. The components may be resident on separate hardware, such as separate removable circuit boards, or share common hardware, such as a same memory and processor for implementing instructions from the memory. Programs may be parts of a single program, separate programs, or distributed across several memories and processors.

To clarify the use of and to hereby provide notice to the public, the phrases "at least one of <A>, <B>, . . . and <N>" or "at least one of <A>, <B>, . . . <N>, or combinations thereof" or "<A>, <B>, . . . and/or <N>" are defined by the Applicant in the broadest sense, superseding any other implied definitions hereinbefore or hereinafter unless expressly asserted by the Applicant to the contrary, to mean one or more elements selected from the group comprising A, B, . . . and N. In other words, the phrases mean any combination of one or more of the elements A, B, . . . or N including any one element alone or the one element in combination with one or more of the other elements which may also include, in combination, additional elements not listed.

While various embodiments have been described, it will be apparent to those of ordinary skill in the art that many more embodiments and implementations are possible. Accordingly, the embodiments described herein are examples, not the only possible embodiments and implementations.

What is claimed is:

1. A storage system comprising:
a solid state memory comprising a first memory and a second memory; and
a storage controller configured to:
copy data from a logical block of the first memory to a logical block of the second memory;
detect any post write read error in the data copied to the logical block of the second memory;
determine that the logical block of the second memory is a partial bad block unusable for storage of a first portion of the data copied to the logical block of the second memory but usable for storage of a second portion of the data copied to the logical block of the second memory in response to detection of a post write read error in the first portion of the data copied to the logical block of the second memory and no post write read error in the second portion of the data copied to the logical block of the second memory; and
update a logical-to-physical map, in response to a determination that the logical block of the second memory is the partial bad block due to detection of the post write read error in the first portion of the data, to indicate that the second portion of the data copied to the logical block of the second memory is stored in the logical block of the second memory and to indicate that the first portion of the data copied to the logical block of the second memory is stored in a location of the solid state memory other than the logical block of the second memory, the logical-to-physical map including a mapping between subsets of the logical block of the second memory and physical locations of the subsets of the logical block of the second memory.

2. The storage system of claim 1, wherein the storage controller is further configured to copy the first portion of the data from the logical block of the first memory to a cache in response to the determination that the logical block of the second memory is a partial bad block usable for storage.

3. The storage system of claim 2, wherein a logical address of the first portion of the data is mapped to a corresponding physical location in the cache.

4. The storage system of claim 2, wherein a logical address of the second portion of the data is mapped to a corresponding physical location in the logical block of the second memory.

5. The storage system of claim 2, wherein the cache is a binary cache.

6. The storage system of claim 1, wherein the storage controller is configured to determine that the logical block of the second memory is the partial bad block usable for storage based on a determination that a number of pages in the first portion of the data is less than a threshold value.

7. A storage device comprising:
a solid state memory comprising a first memory and a second memory;
a means for copying data from a logical block of the first memory to a logical block of the second memory;
a means for detecting any post write read error in the data copied to the logical block of the second memory;
a means for determining that the logical block of the second memory is a partial bad block in response to detection of a post write read error in a first portion of the data and no post write read error in a second portion of the data, wherein the partial bad block is used to store the second portion of the data despite the detection of the post write read error but is not used to store the first portion of the data; and
a means for updating, based on a determination that the logical block of the second memory is the partial bad block due to detection of the post write read error in the first portion of the data, a logical-to-physical map to indicate that the second portion of the data copied to the logical block of the second memory is stored in the logical block of the second memory and to indicate that the first portion of the data copied to the logical block of the second memory is stored in a portion of the solid state memory other than the logical block of the second memory, the logical-to-physical map including a mapping between subsets of the logical block of the second memory and corresponding physical locations of the subsets of the logical block of the second memory.

8. The storage device of claim 7, wherein the first memory has a first memory type and the second memory has a second memory type, and the means for copying comprises a means for folding.

9. The storage device of claim 8, wherein the first memory type is a single level cell (SLC) flash memory and the second memory type is a multi-level cell (MLC) flash memory.

10. The storage device of claim 7, wherein the means for detecting is configured to determine that the logical block of the second memory is the partial bad block usable for storage when a post write read of the second portion of the data succeeds even though a write error occurs when the second portion of the data is copied to the logical block of the second memory.

11. The storage device of claim 10, wherein the write error is a program error.

12. The storage device of claim 10, wherein the write error is a result of a slow to program bit.

13. The storage device of claim 7, wherein the logical block of the first memory is a different size than the logical block of the second memory.

14. The storage device of claim 7, wherein the first memory is a different size than the second memory.

15. The storage device of claim 7, wherein the post write read error is an enhanced post write read error.

16. A method for partial bad block reuse, the method comprising:
copying data from a logical block of a first memory to a logical block of a second memory;
detecting a post write read error in a first portion the data copied to the logical block of the second memory without detection of a post write read error in a second portion of the data copied to the logical block of the second memory;
determining that the logical block of the second memory is a partial bad block usable for storage of the second portion of the data in response to detection of the post write read error in the first portion of the data but not in the second portion of the data; and
updating a logical-to-physical map to indicate that the second portion of the data copied to the logical block of the second memory is stored in the logical block of the second memory, which is the partial bad block, and to indicate that the first portion of the data copied to the logical block of the second memory is stored outside of the logical block of the second memory, the logical-to-physical map including a mapping between subsets of the logical block of the second memory and corresponding physical locations of the subsets of the logical block of the second memory.

17. The method of claim 16 further comprising adding factory marked bad blocks to a free block list, wherein the logical block of the second memory is selected from the free block list.

18. The method of claim 16 further comprising copying the first portion of the data from the logical block of the first memory to a cache in response to determining that the logical block of the second memory is a partial bad block usable for storage.

19. The method of claim 16, wherein at least one of the first memory and the second memory is a three dimensional memory.

* * * * *